United States Patent [19]

Iwai

[11] 4,394,196
[45] Jul. 19, 1983

[54] METHOD OF ETCHING, REFILLING AND ETCHING DIELECTRIC GROOVES FOR ISOLATING MICRON SIZE DEVICE REGIONS

[75] Inventor: Hiroshi Iwai, Takaidonishi, Japan

[73] Assignee: Tokyo Shibaura Denki Kabushiki Kaisha, Kawasaki, Japan

[21] Appl. No.: 282,642

[22] Filed: Jul. 13, 1981

[30] Foreign Application Priority Data

Jul. 16, 1980 [JP] Japan ................................. 55-97223
Jul. 16, 1980 [JP] Japan ................................. 55-97224
Nov. 29, 1980 [JP] Japan ............................... 55-168582

[51] Int. Cl.³ ..................... H01L 21/76; H01L 27/00
[52] U.S. Cl. .................................... 148/187; 29/571;
148/1.5; 156/648
[58] Field of Search ................ 148/187, 1.5; 29/571;
156/648

[56] References Cited

U.S. PATENT DOCUMENTS

| 4,104,086 | 8/1978 | Bondur et al. | 148/1.5 |
| 4,139,442 | 2/1979 | Bondur et al. | 204/192 E |
| 4,140,558 | 2/1979 | Murphy et al. | 148/175 |
| 4,209,349 | 6/1980 | Ho et al. | 148/187 |
| 4,209,350 | 6/1980 | Ho et al. | 148/187 |
| 4,211,582 | 7/1980 | Horng et al. | 148/1.5 |
| 4,252,582 | 2/1981 | Anantha et al. | 29/576 E |
| 4,255,207 | 3/1981 | Nicolay et al. | 148/187 |
| 4,264,382 | 4/1981 | Anantha et al. | 148/187 |
| 4,274,909 | 6/1981 | Venkataraman et al. | 156/648 |
| 4,318,751 | 3/1982 | Horng | 148/1.5 |

Primary Examiner—Upendra Roy
Attorney, Agent, or Firm—Finnegan, Henderson, Farabow, Garrett & Dunner

[57] ABSTRACT

A method for manufacturing a semiconductor device comprising: (a) a step of forming at least one groove(s) at the predetermined portion(s) of a semiconductor substrate; (b) a step of depositing insulating material with a thickness larger than half the opening width of the groove on the whole surface of the semiconductor substrate including the groove to fill the groove with insulating material; and (c) a step of etching the insulating material layer by the thickness thereof on the semiconductor substrate excluding the groove to form a field region consisting of insulating material left at least in the groove.

22 Claims, 70 Drawing Figures

F I G. 4A
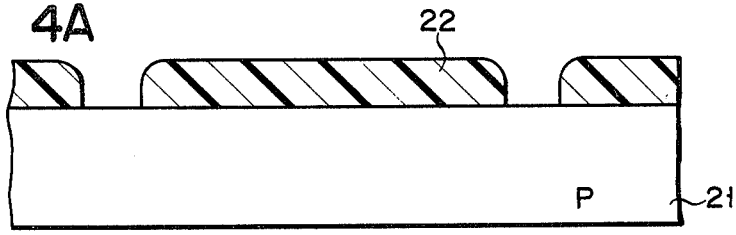
F I G. 4B
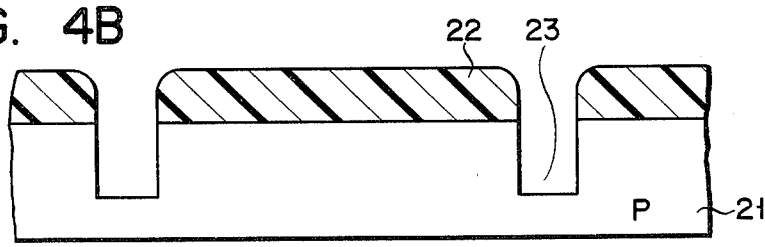
F I G. 4C
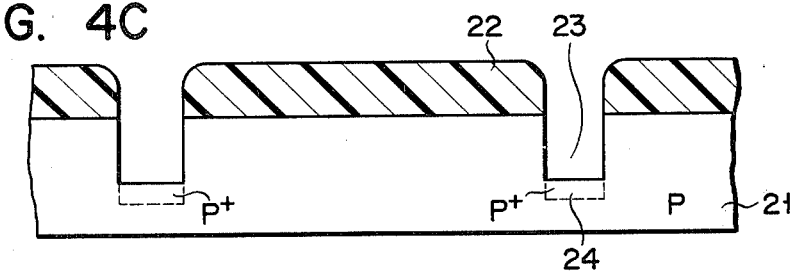
F I G. 4D
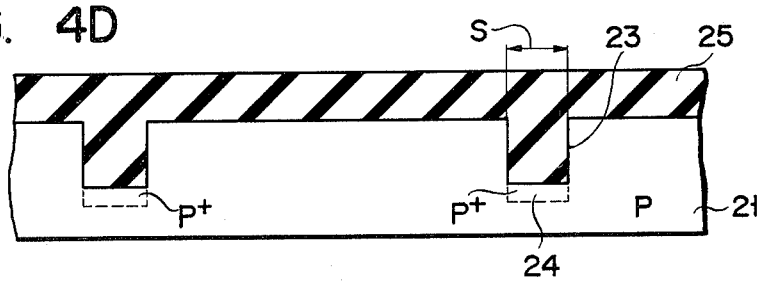
F I G. 4E
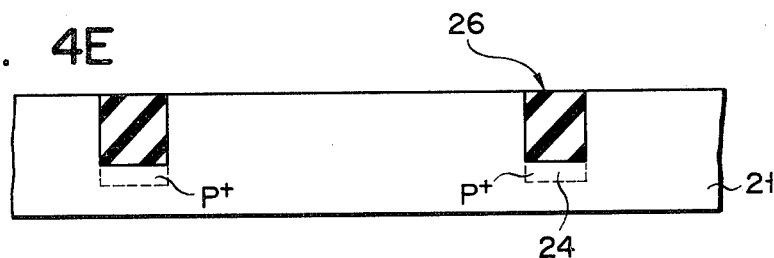

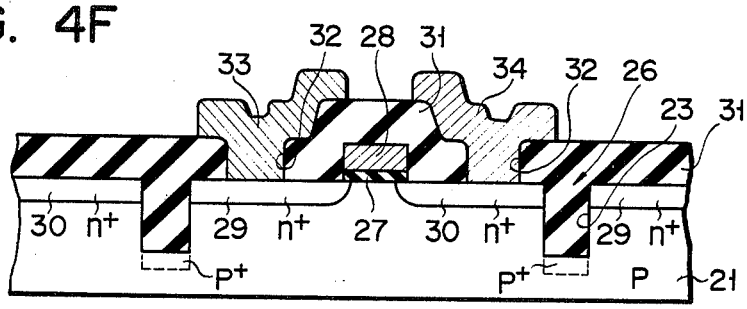
F I G. 4F
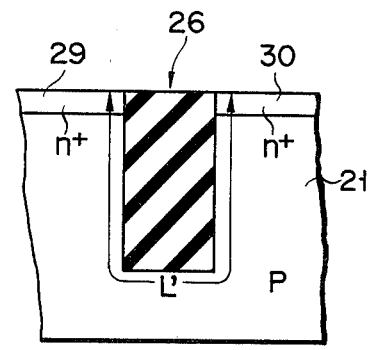
F I G. 5B
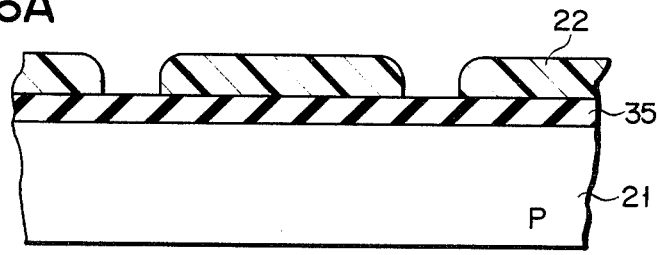
F I G. 6A
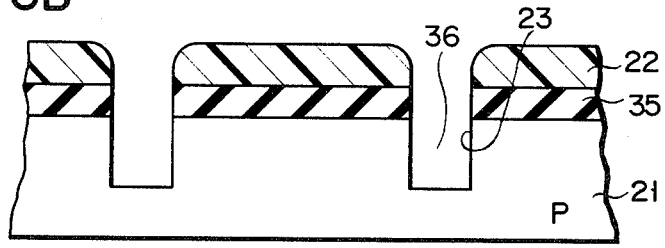
F I G. 6B F I G. 10A
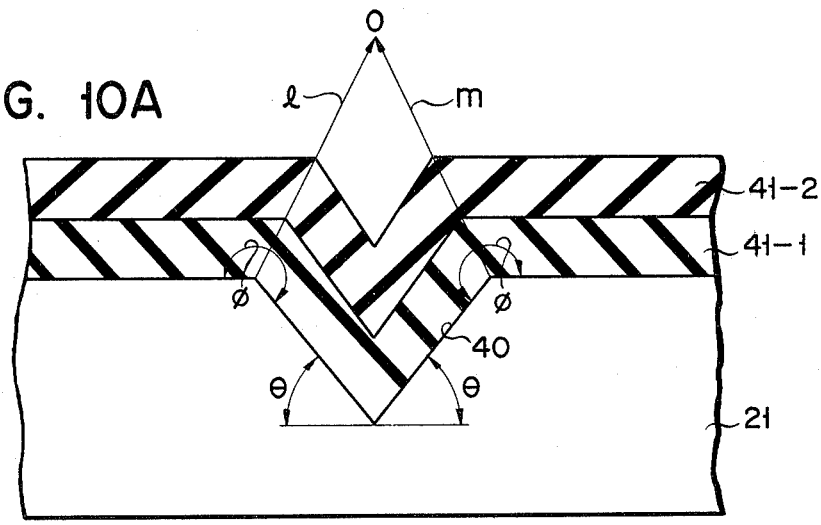
F I G. 10B
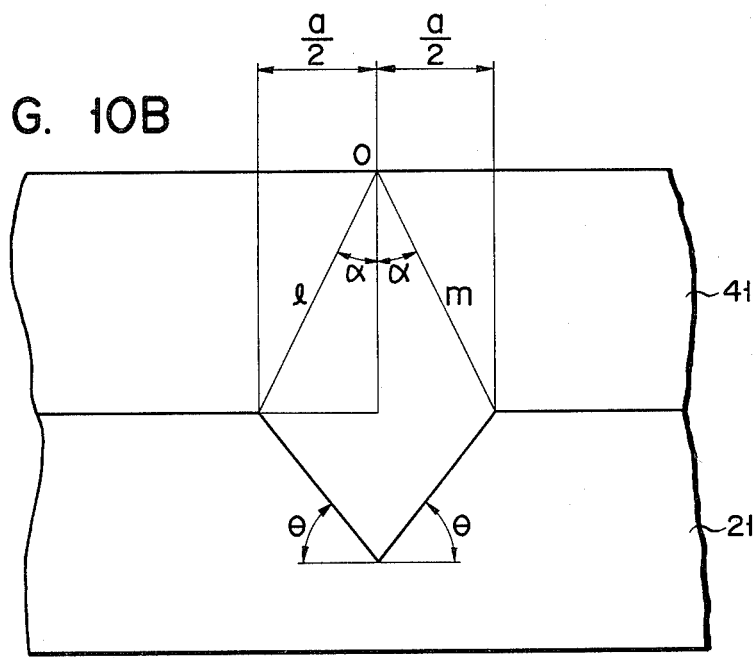

METHOD OF ETCHING, REFILLING AND ETCHING DIELECTRIC GROOVES FOR ISOLATING MICRON SIZE DEVICE REGIONS

BACKGROUND OF THE INVENTION

The present invention relates to a method for manufacturing a semiconductor device and, more particularly, to an improvement of element isolation technique for use in the manufacture of a semiconductor device.

Selective oxidation has been conventionally employed as an isolation process in the manufacture of a semiconductor device, particularly a MOS LSI. An example in which this selective oxidation is applied to the manufacture of an n-channel MOS LSI will be set forth below.

As shown in FIG. 1A, $SiO_2$ film 2 is grown by thermal oxidation on a p-type silicon substrate 1 having crystal orientation (100) and $Si_3N_4$ film 3 is deposited on this $SiO_2$ film 2. Resist film 4 is formed by photolithography at a portion where an element is to be formed and, using resist film 4 as a mask, $Si_3N_4$ film 3, except the portion where the element is to be formed, is removed by etching to form $Si_3N_4$ pattern 3'. Then, by ion-implanting boron, for example, p+-regions 5 are formed at a field region to function as channel stopper regions (FIG. 1B). After resist film 4 is removed, wet oxidation is applied using $Si_3N_4$ pattern 3' as a mask to selectively grow thick field oxide film 6 (FIG. 1C). $Si_3N_4$ pattern 3' and $SiO_2$ film 2 are removed by etching to form a region 7 where the element is to be formed and which is isolated by field oxide film 6 (FIG. 1D). As shown in FIG. 1E, on a portion of region 7 is formed gate oxide film 8, on which gate electrode 9 is further formed. Arsenic, for example, is diffused into the region 7 except the gate region to form n+-regions 10 and 11 which function as source and drain regions, respectively. After $SiO_2$ film 12 is deposited by CVD to form an insulating film between layers, contact holes 13 are formed at those portions corresponding to n+-regions 10, 11 and the gate electrode, and Al interconnection layer patterns 14 are further formed, thus finishing an n-channel MOS LSI.

The method described above, which employs selective oxidation to manufacture MOS LSI, has the following various disadvantages:

FIG. 2 is a detailed view showing a cross-sectioned semiconductor in the process shown in FIG. 1C in which field oxide film 6 is formed using $Si_3N_4$ pattern 3' as a mask. It is usually well known in the selective oxidation method that field oxide film 6 grows penetrating into a region F under $Si_3N_4$ pattern 3'. This region F comprises a region D, a so-called birds' beak, formed in such a way that oxidizing agent diffuses into thin $SiO_2$ film 2 under $Si_3N_4$ pattern 3' and a region E formed in such a way that thick oxide film 6 penetrates sideways. The length of region F amounts to about 1 $\mu$m in the case where field oxide film 6 has a film thickness of 1 $\mu$m and $Si_3N_4$ pattern 3' has a thickness of 1,000 Å and $SiO_2$ film 2 has a thickness of 1,000 Å, for example. For this reason, providing that the distance A between two $Si_3N_4$ patterns 3' is 2 $\mu$m, the width C of field region can not be shortened shorter than 4 $\mu$m because the length of region F is 1 $\mu$m. Therefore, the region F formed by the penetration of field oxide film 6 becomes a big obstacle to high integration of LSI.

This leads to the employment of methods of suppressing the formation of birds' beak region D by thickening $Si_3N_4$ pattern 3' and thinning $SiO_2$ film 2 under $Si_3N_4$ pattern 3' and of suppressing the formation of region F by growing field oxide 6 thin. However, according to the former method, stress becomes large at the end portion of the field region to easily cause failure and, according to the latter method, a problem is caused that field inversion voltage is reduced. Therefore, the selective oxidation method has a limit in the effective manufacturing of highly integrating elements.

In addition, according to the selective oxidation method, boron ion-implanted as a channel stopper rediffuses sideways during field oxidation and p+-regions 5 are formed at a portion of region 7 where the element is to be formed, as shown in FIG. 3A, to thereby reduce the width of the effective element region from G to H. As a result, narrow channel effects of reducing the current of transistor and increasing threshold voltage are caused. It is also important to prevent this phenomenon as well as to make elements fine. As shown in FIG. 3B, the area at which n+-region 11 (or 10) is contacted with p+-region 5 in the element forming region 7 becomes larger by p+-region 5 enlarged sideways to thereby make larger a floating capacitor between n+-regions 10, 11 and the substrate 1. This floating capacitor can not be neglected as elements become smaller.

SUMMARY OF THE INVENTION

The object of the present invention is to provide a method for manufacturing a highly integrated, highly reliable and high quality semiconductor device by allowing optional and fine field regions to be formed in self-alignment.

According to the present invention, a method is provided for manufacturing a semiconductor device, comprising the steps of:
 (a) forming at least one or more groove(s) at a predetermined portion(s) of a semiconductor substrate;
 (b) depositing insulating material to a depth greater than half the width of the groove opening on the whole surface of semiconductor substrate including the groove to fill the groove with insulating material; and
 (c) etching the insulating material layer by the thickness thereof on the semiconductor substrate excluding the groove to form a field region consisting of insulating material left in the at least one groove.

According to the present invention, a further semiconductor device manufacturing method is provided, comprising the steps of:
 (a) forming a plurality of first grooves at predetermined portions of a semiconductor substrate in such a way that at least more than two grooves are arranged adjacent to one another;
 (b) depositing insulating material to a depth greater than half the width of groove opening on the whole surface of semiconductor substrate including first grooves to fill first grooves with insulating material;
 (c) etching the insulating material layer by the thickness thereof on the semiconductor substrate excluding first grooves to leave the insulating material layer in first grooves;
 (d) etching those portions of the semiconductor substrate which are between two adjacent insulating material layers left in first grooves to form second grooves;

(e) depositing insulating material with a thickness larger than half the width of second groove opening on the whole surface of the semiconductor substrate including second grooves to fill second grooves with insulating material; and (f) etching the insulating material layer by the thickness thereof on the semiconductor substrate excluding second grooves to form a wide field region consisting of insulating material layer left in the second groove and insulating material layers left in first grooves on both sides of the second groove.

According to the present invention, a still further semiconductor device manufacturing method is provided, comprising the steps of:

(a) forming a plurality of first grooves at predetermined portions of a semiconductor substrate in such a way that at least more than two grooves are arranged adjacent to one another;

(b) depositing insulating material to a depth greater than half the width of first groove opening on the whole surface of semiconductor substrate including first grooves to fill these first grooves with insulating material;

(c) etching the insulating material layer by the thickness thereof on the semiconductor substrate excluding the first grooves to leave the insulating material layer in the first grooves;

(d) etching those portions of the semiconductor substrate which are between two adjacent insulating material layers left in the first grooves to form second grooves; and (e) applying field oxidation to the second grooves using oxidation-resistive film as a mask to fill these second grooves with oxide film, forming a wide field region made integral by this oxide film and insulating material layers left in the first grooves on both sides of the oxide film.

BRIEF DESCRIPTION OF THE DRAWINGS

FIGS. 4A-4F are sectional views showing an n-channel MOS LSI manufacturing process employed in Example 1 of the present invention;

FIGS. 5A and 5B are sectional views showing channel lengths between elements isolated by field regions which are formed by the conventional method and in Example 1, respectively;

FIGS. 6A and 6B are sectional views showing variations of those in Example 1;

FIGS. 10A and 10B are enlarged sectional views for explaining the process shown in FIG. 9E;

DETAILED DESCRIPTION OF THE PREFERRED EMBODIMENTS

Figure 1A:
FIGS. 1A-1F are sectional views showing the conventional n-channel MOS LSI manufacturing process in which selective oxidation is employed.
Figure 1B:
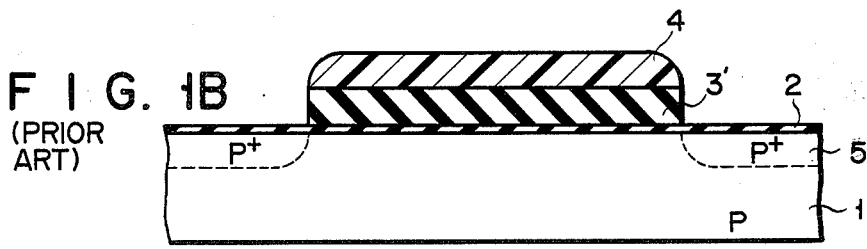
Figure 1C:
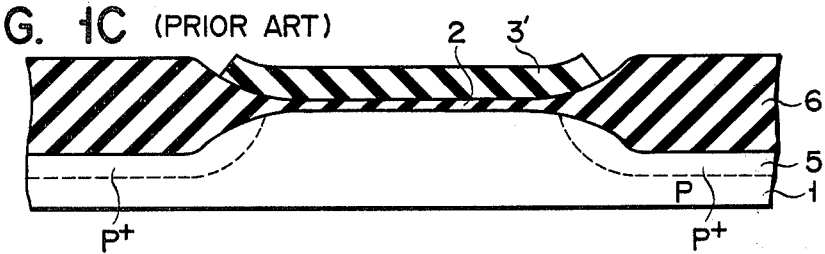
Figure 1D:
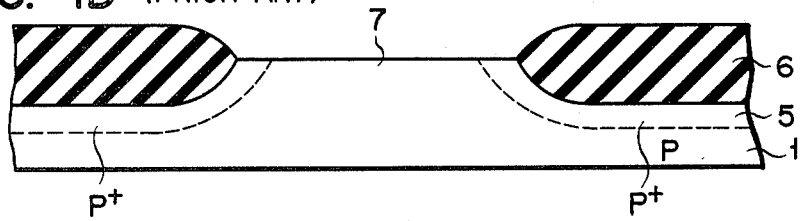
Figure 1E:
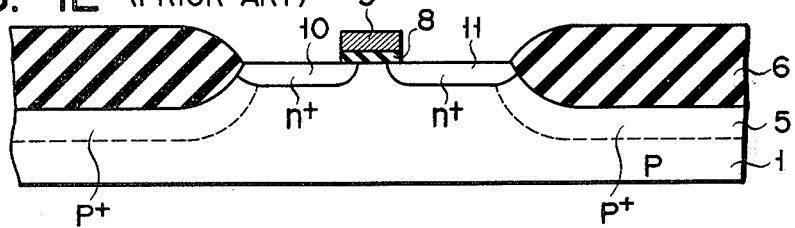
Figure 1F:
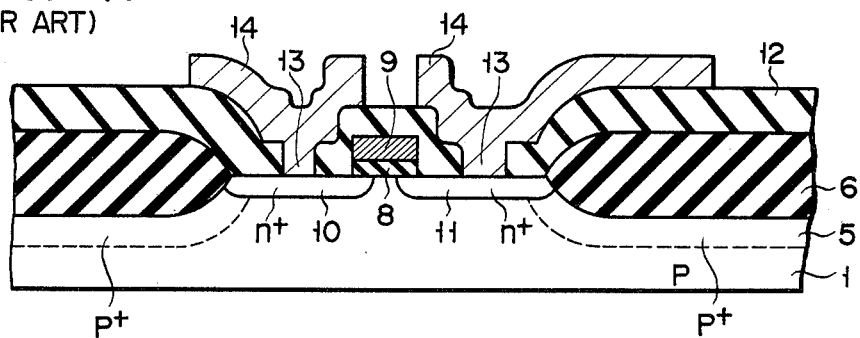
Figure 2:
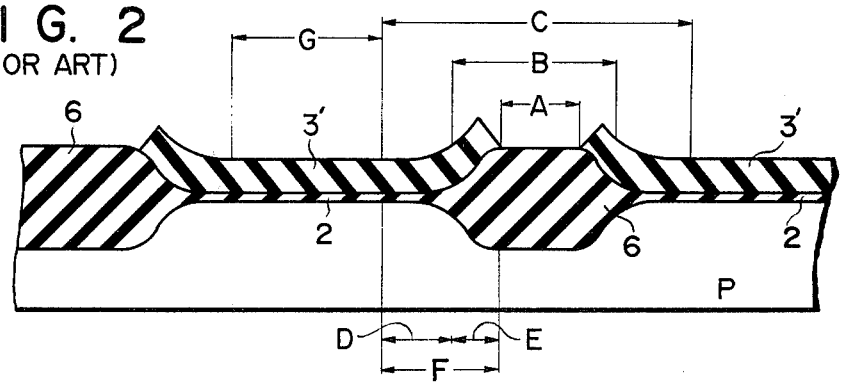
FIG. 2 is an enlarged sectional view similar to FIG. 1C.
Figure 3A:
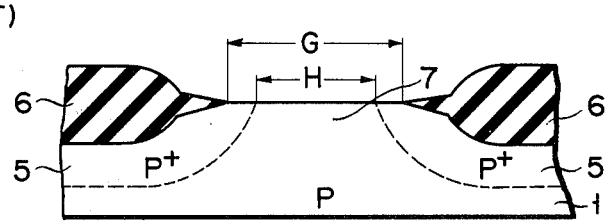
FIGS. 3A and 3B are sectional views for explaining disadvantages of a conventional selective oxidation method.
Figure 3B:
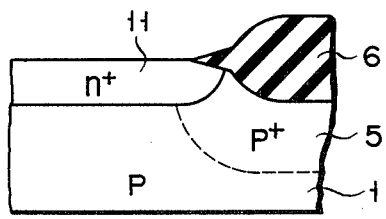

The present invention is based on a fact that when, on the surface of a semiconductor substrate having more than one groove formed at predetermined portions thereof, there is deposited insulating material with a thickness or depth greater than half the width of the groove opening, grooves are filled with insulating material and when the deposited insulating material layer is then etched, the deposited insulating material layer is still left in grooves even if the insulating material layer is removed at those portions which exclude groove portions. The present invention intends to employ this fact in the formation of field regions. According to the present invention, optional and fine field regions are formed in self-alignment without employing selective oxidation. Therefore, the present invention makes it possible to overcome various disadvantages caused in the case where conventional selective oxidation as described above is employed.

The reason why grooves are filled regardless of the depth of the grooves by depositing insulating material with a thickness or depth greater than half the width of the groove opening, is that the deposition of insulating material has no direction and develops at the side faces of grooves.

The present invention will be now described in detail.

After masking material like a resist pattern, for example, is formed on a semiconductor substrate except at those portions where grooves are to be formed, the semiconductor substrate exposed through openings of this masking material is etched to a desired depth to form grooves. Etching techniques which may be employed include ion etching, reactive ion etching, wet etching such as KOH and the like. It is not necessary that the side faces of the groove is formed vertically. Grooves may is tapered or reversely tapered to have a sloped angle θ. When reactive ion etching is used, grooves having substantially vertical side faces are obtained and when silicon substrate having crystal orientation (100) is selectively etched by KOH, grooves tapered to have the sloped angle θ are obtained. Tapered grooves may include those having a V-shaped cross section, a flat bottom or curved side faces. The number of grooves may be one or more than two, and grooves may be different from one another in their width and depth.

After the masking material is removed, insulating material is deposited with a thickness larger than half the groove opening on the whole surface of the semiconductor substrate including the inside of the grooves to fill the grooves with insulating material completely. In the case of tapered grooves whose side faces have the sloped angle $\theta$, the thickness of insulating material to be deposited may be $(a \cdot \cot\theta/2)/2$ wherein "a" represents the width of the groove opening. Insulating material which may be used includes, for example, $SiO_2$, $Si_3N_4$, $Al_2O_3$ or the like, or low-melting-point insulating material such as phosphorus silicate glass and boron phosphorus silicate glass, if necessary. Methods of depositing insulating material which may be employed include the CVD method and the PVD method such as sputtering, or the like. When the thickness of insulating material to be deposited is smaller than half the width of groove opening or $(a \cdot \cot\theta/2)/2$, the grooves are not completely filled with insulating material, and recesses are formed at the groove openings, thus causing such disadvantage that insulating material which is left in the grooves and which must not be etched is etched upon subsequent etching of insulating material on the substrate.

Prior to the deposition of insulating material, the inside, preferably only the bottom, of the grooves may be doped by impurity of the same conductivity type as that of the substrate to form channel stopper regions in the substrate. Prior to the deposition of insulating material, the whole surface of the substrate including the inside surface of the grooves or at least a portion of inside surface of the grooves may also be subjected to oxidization or nitrization to form oxide film or nitride film which does not fill the grooves. When this oxide film or nitride film is formed, field regions consisting of dense oxide or nitride film and insulating material layer are subsequently formed which more extremely enhance element separation capacity as compared with those consisting of insulating material only.

After the deposition of insulating material, the whole surface or a part of the surface of this insulating material may be doped by, for example, boron, phosphorus, arsenic or the like and then heat-treated to melt the doped layer, or a low melting point insulating material such as boron phosphorus silicate glass (BPSG), phosphorus silicate glass (PSG) and arsenic silicate glass (AsSG) may be deposited on the whole or a part of the insulating material layer and then melted. When the insulating material layer deposited in grooves is recessed depending upon the condition under which the insulating material is deposited, one of these treatments enables the recessed portion to be made flat, thus preventing the surface of insulating material in the grooves from being made lower than the level of the groove opening in the subsequent etching process.

Then, insulating material film deposited on the semiconductor substrate is removed by etching, without using masking material, until the semiconductor substrate, excluding the grooves, is exposed while leaving insulating material in the grooves to thereby form field regions. Etching which may be employed includes plasma etching, reactive ion etching or the like.

Thereafter, active elements such as MOS transistors and bipolar transistors are formed at portions where elements are to be formed and these elements are isolated by field regions thus formed to thereby finish the manufacture of a semiconductor device.

As described above, the method of the present invention enables insulating material to be left in grooves in self-alignment without mask alignment margin to form field regions, thus resulting in a semiconductor device having the following attributes;

(1) The area of the field region is determined by the area of the inside surface of the groove formed in the substrate. Therefore, fine field regions can be easily formed by masking a smaller area for the inside surface of the grooves to thereby provide a highly integrated semiconductor device.

(2) Regardless of the area thereof, the depth of field region is determined by the depth of the groove and can be optionally selected by adjusting the depth of the groove. Therefore, current leak between elements can be surely prevented at such field region by deepening the groove to form a deep field region, thus allowing a high quality semiconductor device to be provided.

(3) After an impurity for a channel stopper is implanted to the surfaces of the grooves, the thermal oxidation step carried out under high temperature and for a long time in the conventional selective oxidation method is not employed, thus preventing impurity regions in the inside surface of the grooves from being re-diffused to penetrate into the surface of portions where elements are to be formed and to make smaller effective element forming regions. When the doping of impurity is carried out by ion-implantation in this case, the ion-implanted layer can be formed only on the bottom of the grooves and even if impurity in the ion-implanted layer is re-diffused, the ion-implanted layer is not penetrated into the surface of element forming regions, thus preventing the negative effects of having impurity regions formed at element forming regions as well as preventing effective element forming regions from being made smaller.

(4) When field regions are formed leaving insulating material in grooves in such a way that grooves are completely filled with insulating material, the substrate is made flat, thus preventing interconnection electrodes from being disconnected in the subsequent formation of interconnection electrodes.

In the embodied mode of the present invention as described above, insulating material on the semiconductor substrate excluding grooves is entirely removed by etching, but the present invention is not limited to this and it is possible to leave a part of the insulating material on the semiconductor substrate. Namely, after the insulating material is deposited with a thickness larger than half the width of groove opening on the whole surface of semiconductor substrate, including the grooves, to fill the grooves with insulating material completely, those regions of the insulating material layer on the substrate excluding the grooves at which field regions are to be formed and/or partial regions of the insulating material layer on the substrate including a part of the regions of insulating material layer on the grooves are coated with masking material such as resist pattern, for example. Until portions of the substrate, excluding portions coated with the masking layer and grooves, are exposed, the insulating material layer is etched leaving the insulating material layer in the grooves and at portions coated with the masking layer to thereby form field regions. In this case, field regions formed on the substrate excluding the grooves may be made integral with those formed in grooves. Active elements such as MOS transistors and bipolar transistors are then formed at those regions where elements are to be formed and which are isolated by field regions, thus finishing the manufacture of a semiconductor device provided with field regions embedded in grooves and those formed integral with or separated from field regions in grooves on the semiconductor substrate excluding grooves.

The above-mentioned method has various merits. It is certain, for example, that the method is advantageous in the formation of LSI having narrow field regions but has a problem in the formation of LSI having wide field regions. The width S of the field regions is determined by that of the grooves, and insulating film must have a thickness (T) which is larger than 1/2S so as to be left in the grooves. Therefore, when the width of field region is large, insulating film must be deposited with a substantially large thickness. When a field region having a width of 20 μm is formed, for example, the thickness of the insulating film must be made more than 10 μm, which causes many difficult problems as to the depositing time, accuracy of film thickness and condition under which no crack is caused. In addition, it becomes extremely difficult to form by the above-mentioned method a field region which has a thickness of 200 μm and which resides under Al bonding to pads, for example. Therefore, in the case of needing a wide field region, such a method can be employed that a narrow field region is embedded according to the above-mentioned method, and insulating film (SiO$_2$), for example, is then deposited and removed by photo-etching leaving some part thereof to form a wide field region.

This method enables wide field oxide film to be formed and eliminates most of the disadvantages of the selective oxidation method. There is a big disadvantage, however, under certain circumstances. Namely, flatness is lost because of a stepped portion caused at the end of wide field film. In the case of the selective oxidation method, half of the field film is embedded in the silicon substrate, but in the case of this method, the whole thickness of the field film contributes to the formation of a stepped portion so that the stepped portion is made more extreme as compared with that in the selective oxidation method, which becomes a big obstacle in the case where micro-lithography is needed at the regions adjacent to the wide field film.

The following two methods are employed to overcome these disadvantages and to form wide field regions:

A first method comprises forming in the semiconductor substrate, by the same method as the above-mentioned one, first grooves which are at least two in number and which are adjacent to one another, filling these first grooves with insulating material, removing by etching that portion of semiconductor substrate which is between any two of the insulating material layers filled in the first adjacent grooves to form a second groove or grooves, filling the second groove with insulating material in the same manner as the first grooves and making coalescent the insulating material layer in the second groove(s) with those in the first grooves positioned on both sides of the second groove(s) to result in a wide field region.

The second method comprises forming in the semiconductor substrate, by the same method as the above-mentioned one, first grooves which are at least two in number and which are adjacent to one another, filling these first grooves with insulating material, removing by etching that portion of the semiconductor substrate which is between any two of the insulating material layers filled in the first adjacent grooves to form a second groove or grooves, subjecting the second groove(s) to field oxidation using an oxidation-resistive film as a mask to fill the second groove(s) with oxide film and making coalescent the oxide film with the insulating material layers filled in the first grooves positioned on both sides of second groove(s) to result in a wide field region.

In these two methods to form wide field regions, it is possible to form one or more other grooves at a position remote from the group of first adjacent grooves. Variations of above-mentioned method to form narrow field regions can also be applied to these two methods.

Various examples in which the method of the present invention is applied to the manufacture of n-channel MOS LSI will be described with reference to the drawings.

EXAMPLE 1

(I) A resist pattern 22 was formed by photo-etching on a p-type silicon substrate 21 having a crystal face (100), by removing portions of resist pattern 22 which correspond to portions at which grooves were to be formed (FIG. 4A). The silicon substrate 21 was etched by reactive ion etching using the resist pattern 22 as a mask. As shown in FIG. 4B, grooves 23, each having substantially vertical side faces, a width of 1 μm and a depth of 2 μm, were arranged parallel. After boron, which is an impurity of the same conductivity type as that of substrate 21, was ion-implanted under an acceleration voltage of 50 keV and dose amount of $5 \times 10^{12}$/cm$^2$ using the resist pattern 22 as the mask, heat treatment was applied to form p$^+$-regions 24 for channel stoppers under bottoms of groove 23 (FIG. 4C).

(II) After the resist pattern 22 was removed, SiO$_2$ was deposited by CVD with a thickness (0.6 μm) larger than half (0.5 μm) the width (S) of groove opening. SiO$_2$ was progressively deposited on the substrate 21 and the inside surface of grooves 23 and a CVD-SiO$_2$ film 25 was formed fully filling grooves 23 as shown in FIG. 4D. At the time of deposition of SiO$_2$ no re-diffusion of the impurity in p$^+$-regions 24 was caused because a heat oxidation treatment carried out under high temperature and for as long a time as in the selective oxidation method was made unnecessary.

(III) The CVD-SiO$_2$ film 25 was all etched by ammonium fluoride until all portions of silicon substrate 21 except those of grooves 23 was exposed. The CVD-SiO$_2$ film 25 was removed at this time only by the portion corresponding to the thickness thereof on the substrate 21, leaving CVD-SiO$_2$ only in grooves 23 as shown in FIG. 4E to thereby form field regions 26 embedded in the substrate 21. According to the usual manner, a gate electrode 28 consisting of polycrystalline silicon was formed on an island region which was isolated by field regions 26. A gate oxide film 27 was interposed between the gate electrode 28 and the substrate 21, and arsenic diffusion was applied to form n$^+$-regions 29 and 30 which functioned as a source and a drain, respectively. An interposing insulating film 31 consisting of CVD-SiO$_2$ was further deposited, and after contact holes 32 (contact holes for gate electrode are not shown) were formed in those portions of interposing insulating film 31 which corresponded to the gate electrode 28 and n$^+$-regions 29 and 30, Al film was deposited over the whole surface thereof and was patterned, and an Al electrode 33 for the source, an Al electrode 34 for the drain and an Al electrode for the gate (not shown) were formed to thereby provide an n-channel MOS LSI (FIG. 4F).

Figure 5A:
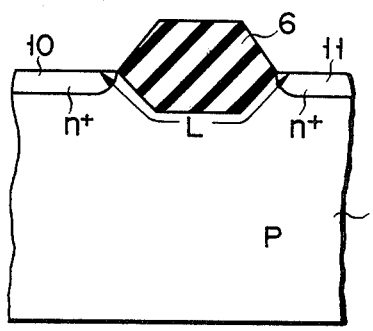

The MOS LSI obtained in Example 1 could be extremely micro-sized to have a width of 1 μm because the field region 26 was determined by the width of groove 23, thus allowing the area of field regions in the LSI to be reduced and the high integration of LSI to be attained accordingly. If the field oxide film 6 having such a narrow width as shown in FIG. 5A was formed by the conventional selective oxidation method, the length (L) between elements would be short and the threshold voltage of a parasitic field MOS transistor reduced, causing leak current to flow between elements. In contrast, the field region 26 of Example 1 was narrow in width as shown in FIG. 5B but had a full depth of 2 μm, for example, so that channel length (L') between elements could be made long enough to prevent leak current from flowing between elements.

In addition, the silicon substrate 21 was made flat having no stepped portion between the field region and the element forming region after the formation of field regions 26, as shown in FIG. 4E. Therefore, when Al electrodes 33 and 34 were formed, discontinuity of Al electrodes at the regions between the field region and the element forming region could be prevented. Since p$^+$-regions 24 which function as channel stopper regions were present under the bottom of grooves 23, they were not diffused into the element forming region, thus preventing the element property from being degraded due to a narrow channel effect, and the floating amount of n$^+$-regions 29 and 30 was prevented from being increased because of contact between the p$^+$-region 24 and the n$^+$-regions 29, 30, which function as source and drain, respectively. Further, since field oxidation carried out in the selective oxidation method was made unnecessary, the occurrence of the failure of silicon substrate due to stress caused at the time when the field oxide film would penetrate under the Si$_3$N$_4$ film could be prevented.

Figure 7A:
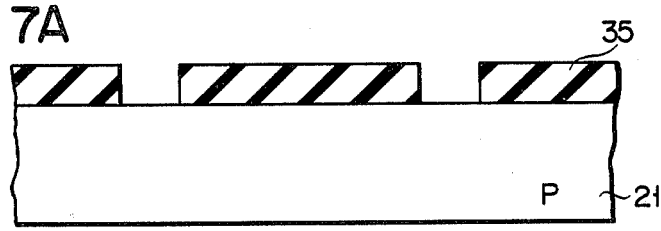
FIGS. 7A and 7B are sectional views showing other variations of those in Example 1.
Figure 7B:
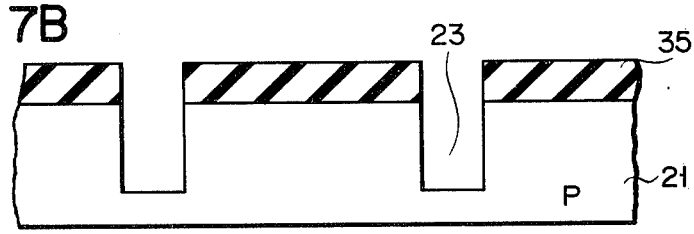

Although grooves 23 are formed in the substrate 21 using the resist pattern 22 as a mask after the resist pattern 22 is formed directly on the silicon substrate 21 in Example 1, there may be employed a process comprising depositing an insulating film 35 such as an SiN film on the silicon substrate 21 as shown in FIG. 6A, followed by forming the resist pattern 22 thereon, etching the insulating film 35 by reactive ion etching using the resist pattern as the mask to form holes 36 therein, and further forming grooves 23 associated with holes 36 in the substrate 21 (FIG. 6B). In this case, the insulating film 35 on the silicon substrate 21 may be patterned as shown in FIG. 7A and reactive ion etching then be applied thereto using this insulating film as the mask to form grooves as shown in FIG. 7B. The insulating film 35 is then removed and SiO$_2$ is deposited on the whole surface of substrate 21 by the same process as shown in FIG. 4D. However, it is also possible to deposit SiO$_2$ without removing the insulating film 35.

Figure 8A:
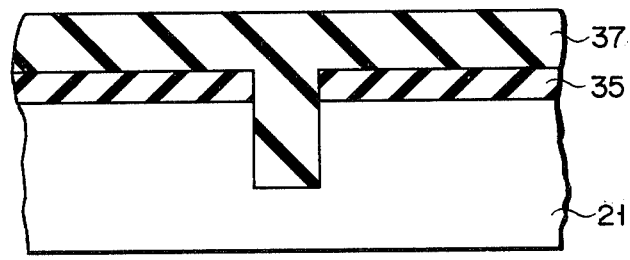
FIGS. 8A-8C are sectional views showing further variations of those in Example 1.
Figure 8B:
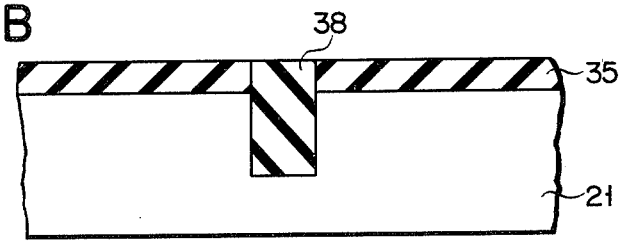
Figure 8C:
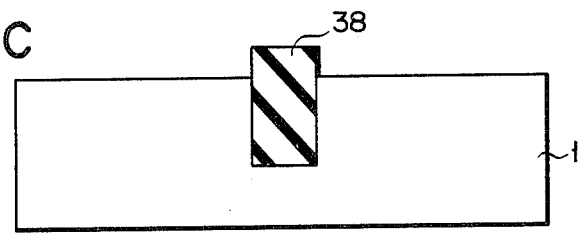

As shown in FIG. 8A, the groove is formed using the SiN film 35 as a mask, for example, and SiO$_2$ is then deposited to form an SiO$_2$ film 37, which fills the groove completely. Thereafter, the SiO$_2$ film 37 is etched, but it is not necessary that the film 37 be etched until the substrate 21 is exposed. Instead etching may be carried out until the SiN film 35 is exposed, as shown in FIG. 8B. The SiN film 35 may then be etched as shown in FIG. 8C. Any SiO$_2$ film 38 which is left in the groove at this time projects from the substrate 21, but this is often more advantageous because the surface of projected SiO$_2$ film 38 is etched in the subsequent process of using ammonium fluoride to thereby make its film thickness smaller.

EXAMPLE 2

Figure 9A:
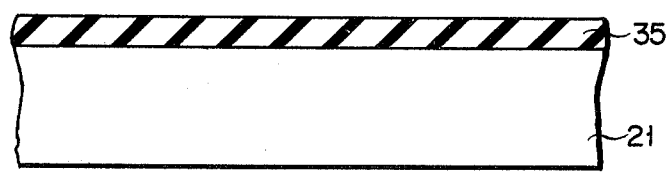
FIGS. 9A-9E are sectional views showing an n-channel MOS LSI manufacturing process in Example 2 of the present invention.
Figure 9B:
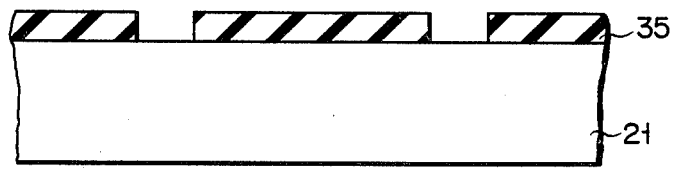
Figure 9C:
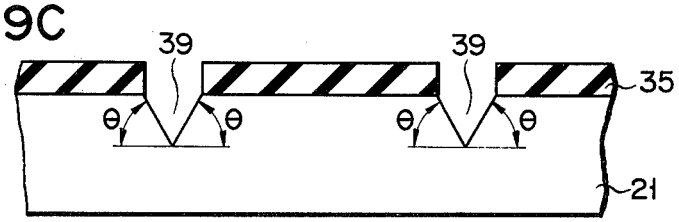
Figure 9D:
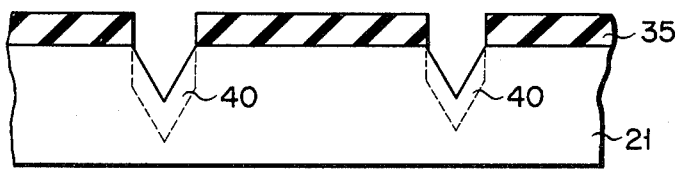

As shown in FIG. 9A, the insulating film 35 such as an oxide film, for example, was deposited on the p-type silicon substrate 21 having crystal face (100), and the oxide film 35 was then patterned by photolithography (FIG. 9B). The silicon substrate 21 was etched by KOH using the oxide film pattern 35 as a mask. As shown in FIG. 9C, grooves 39 each having side faces sloped by an angle θ and having a V-shaped cross section were formed. Using the oxide film pattern 35 as the mask, boron, which is an impurity of the same conductivity type as that of substrate 21, was ion-implanted under an accelerating voltage of 50 keV and dose of $5 \times 10^{12}$/cm$^2$ and heat treatment was then applied thereto to form p$^+$-regions 40 under the bottom of grooves 39, respectively, said p$^+$-regions functioning as channel stopper regions (FIG. 9D).

Figure 9E:
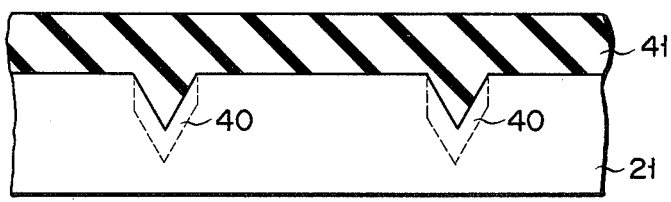

After the oxide film pattern 35 was removed, SiO$_2$ was deposited by the CVD method on the whole surface thereof. The film thickness of SiO$_2$ deposited was larger than (a·cot θ/2)/2 providing that the width of groove opening was denoted by "a". SiO$_2$ was gradually deposited on the substrate 21 and the inner surface of grooves 40, and a CVD-SiO$_2$ film 41 was formed filling grooves 40 completely, as shown in FIG. 9E.

The formation of SiO$_2$ film 41 will be described in more detail referring to FIGS. 10A and 10B. When SiO$_2$ is deposited in the groove 40 whose side faces have the sloped angle θ, the groove 40 becomes shallower gradually as the SiO$_2$ film is deposited to form its layers 41-1, 41-2, . . . successively. When the SiO$_2$ film is deposited thicker than a point 0 at which bisectors l and m of angles φ, which angles φ are formed by the side faces of groove 40 and the surface of substrate, intersect each other, then the groove 40 is completely filled with SiO$_2$. Providing that angles formed by bisectors l, m and a vertical line are represented by α, α equals to θ/2. Therefore, the thickness of SiO$_2$ film at the point 0 is:

$$t = a/2 \times \cot \theta/2 = (a \cdot \cot \theta/2)/2$$

Then, according to the same process as that in Example 1, there can be manufactured an n-channel MOS LSI provided with field regions which were formed by filling V-shaped grooves with SiO$_2$ completely.

EXAMPLE 3

Figure 11A:
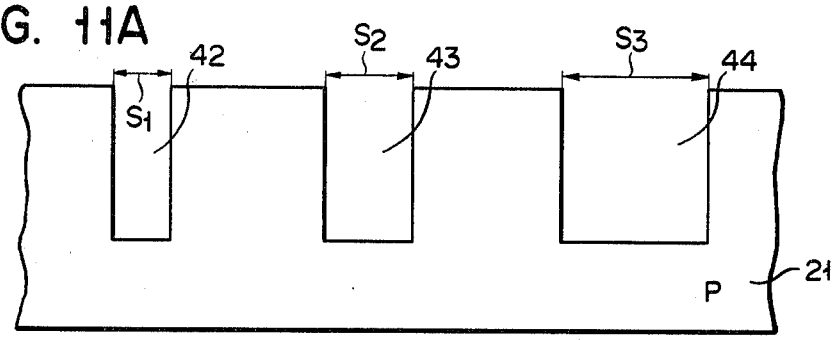
FIGS. 11A-11C are sectional views showing an n-channel MOS LSI manufacturing process in Example 3 of the present invention.
Figure 11B:
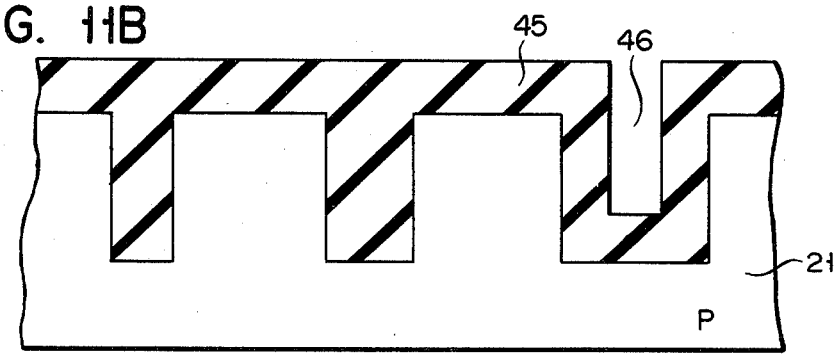

(I) As shown in FIG. 11A, three kinds of grooves 42, 43 and 44 having different opening widths $S_1$, $S_2$ and $S_3$, respectively, were formed in the p-type silicon substrate 21 by photolithography in which reactive ion-etching was used. The relation among $S_1$, $S_2$ and $S_3$ was $S_1 < S_2 < S_3$. SiO$_2$ was then deposited by CVD with a thickness a little larger than half the width ($S_2$) of groove 43. As shown in FIG. 11B, grooves 42 and 43 are filled with a CVD-SiO$_2$ film 45, but the groove 44 which had an opening width larger than those of grooves 42 and 43 had the CVD-SiO$_2$ film 45 deposited only on the inner surface thereof leaving a recess 46 in the center thereof.

Figure 11C:
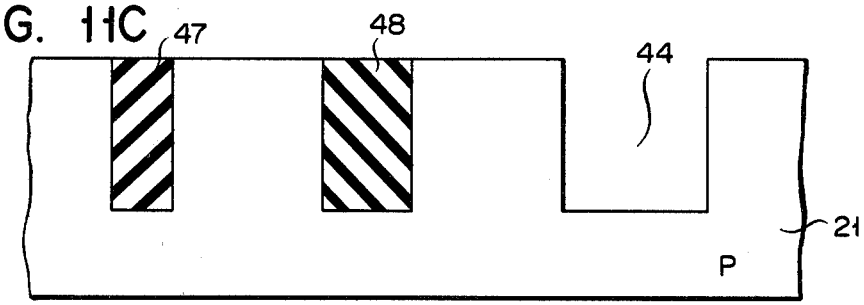

(II) The CVD-SiO$_2$ film 45 on the substrate 21 was then etched by ammonium fluoride by the amount corresponding to the thickness (about $S_2/2$) of CVD-SiO$_2$ film 45. As shown in FIG. 11C, CVD-SiO$_2$ was left in grooves 42 and 43 which had opening widths $S_1$ and $S_2$ to form predetermined field regions 47 and 48, but all of CVD-SiO$_2$ in the groove 44 was removed leaving a recessed portion. This recessed portion could be used as a V MOS region or the like in the subsequent process, thus making unnecessary photolithography to form recesses again after the formation of field regions.

EXAMPLE 4

Figure 12A:
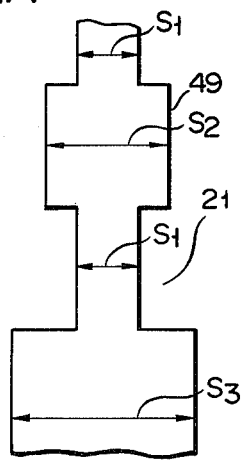
FIGS. 12A and 12B are sectional views showing a process of the forming field regions of MOS LSI in Example 4 of the present invention.
Figure 12B:
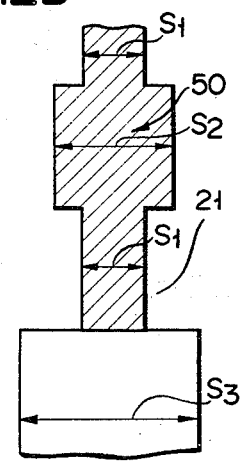

As shown in FIG. 12A, a groove 49 whose opening width changed to be $S_1$, $S_2$, $S_1$ and $S_3$ was formed in the p-type silicon substrate 21 by photolithography in which reactive ion-etching was employed. The relation among $S_1$, $S_2$ and $S_3$ was $S_1 < S_2 < S_3$. SiO$_2$ was then deposited by CVD with a thickness or depth a little larger than half the opening width ($S_2$) to completely fill the CVD-SiO$_2$ film in portions of groove 49 corresponding to its opening widths $S_1$ and $S_2$ and to leave the CVD-SiO$_2$ film deposited only on the inner surface portions of groove 49 corresponding to its opening width $S_3$. Thereafter, the CVD-SiO$_2$ film on the substrate 21 was etched by ammonium fluoride by the amount corresponding to the thickness of the CVD-SiO$_2$ film. As the result, a field region 50 was obtained having portions $S_1$ and $S_2$ of groove 49 filled with the CVD-SiO$_2$ film and the portion $S_3$ of groove 49 from which CVD-SiO$_2$ film was removed.

EXAMPLE 5

Figure 13A:
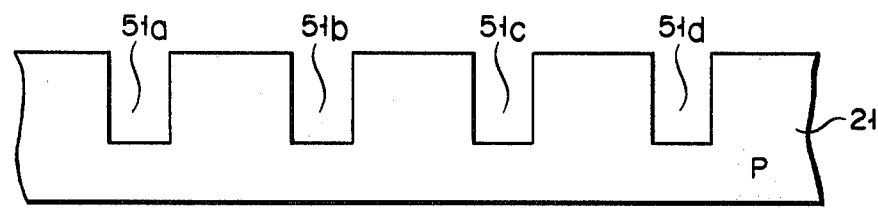
FIGS. 13A-13D are sectional views showing a process of the forming field regions of MOS LSI in Example 5 of the present invention.
Figure 13B:
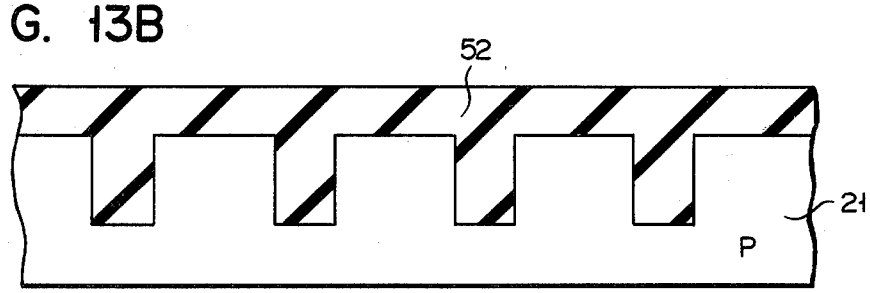

(I) A plurality of grooves 51a, 51b, 51c and 51d having a same opening width and associated with one another were formed in the p-type silicon substrate 21, as shown in FIG. 13A. SiO$_2$ was deposited by CVD with a thickness or depth larger than half the width of these groove openings to form a CVD-SiO$_2$ film 52 (FIG. 13B).

Figure 13C:
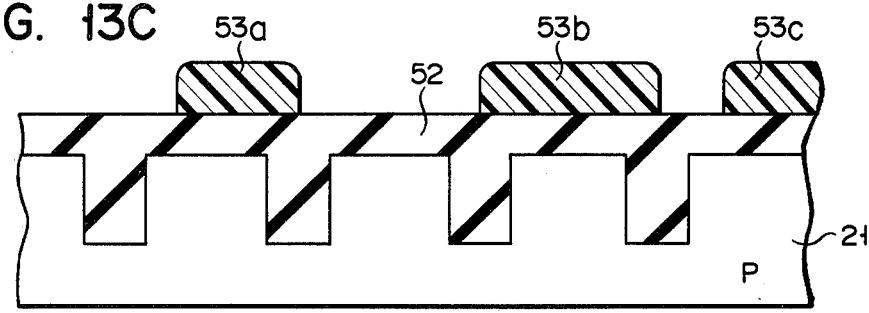
Figure 13D:
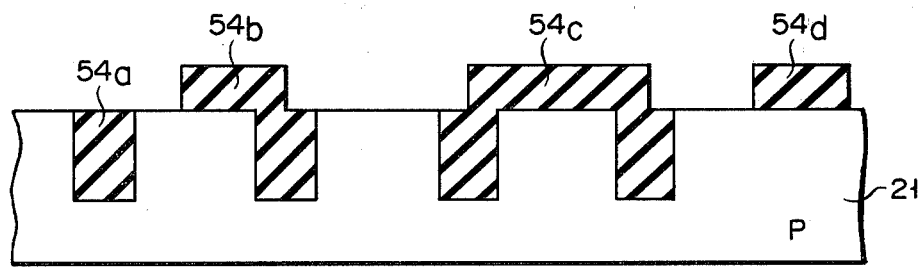

(II) The portion of CVD-SiO$_2$ film 52 occupying the substrate 21 and a part of groove 51b, the portion of CVD-SiO$_2$ film 52 occupying a part of groove 51c and a part of groove 51d, and the portion of CVD-SiO$_2$ film 52 occupying only the substrate 21 were coated by photolithography with resist films 53a, 53b and 53c, respectively (FIG. 13C). Thereafter, etching was carried out using ammonium fluoride until the portion of substrate 21 except those covered by resist films 53a, 53b and 53c and except grooves 51a-51d were exposed. As the result, a field region 54a was formed leaving CVD-SiO$_2$ in the groove 51a, a field region 54b was formed integral by CVD-SiO$_2$ left in the groove 51b and CVD-SiO$_2$ left on the substrate 21, a field region 54c was formed integral by CVD-SiO$_2$ left in grooves 51c and 51d and CVD-SiO$_2$ left on the substrate 21, and a field region 54d was formed by CVD-SiO$_2$ left on the substrate 21, as shown in FIG. 13D. When a plurality of MOS transistors were arranged according to the usual manner on the substrate 21, field regions 54b, 54c and 54d formed leaving CVD-SiO$_2$ on the substrate 21 were used to form a wiring pattern.

EXAMPLE 6

Figure 14A:
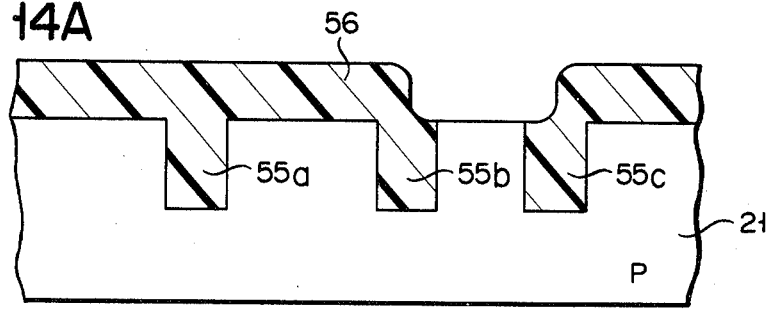
FIGS. 14A-14E are sectional views showing a process of forming field regions of the MOS LSI in Example 6 of the present invention.
Figure 14B:
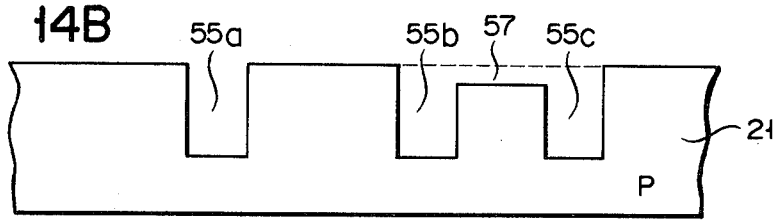

(I) Three grooves 55a, 55b and 55c each having the same opening width were formed in the p-type silicon substrate 21 by photolithography in which reactive ion-etching was employed. A resist pattern 56 was formed with a portion corresponding to the substrate 21 between grooves 55b and 55c removed by photolithography (FIG. 14A). The surface of substrate 21 between grooves 55b and 55c was etched using the resist pattern 56 as a mask to form a removed portion 57. The resist pattern 56 was then removed (FIG. 14B).

Figure 14C:
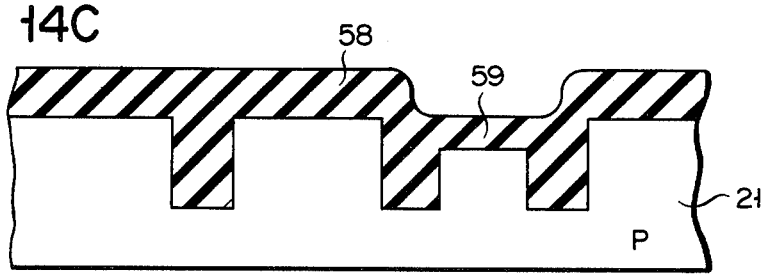

(II) SiO$_2$ was deposited by CVD with a thickness or depth a little larger than half the width of the groove opening. As shown in FIG. 14C, grooves 55a, 55b and 55c were completely filled with a CVD-SiO$_2$ film 58, but the CVD-SiO$_2$ film 58 was recessed at a portion 59 corresponding to the recessed portion 57.

Figure 14D:
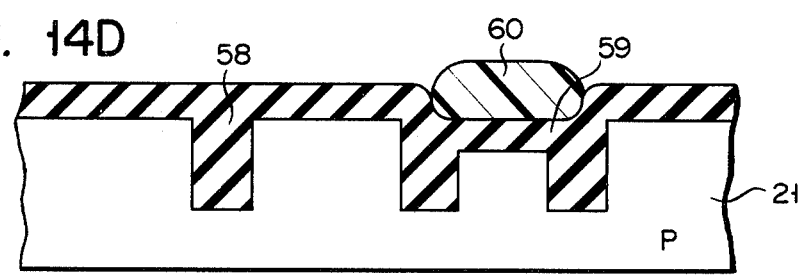
Figure 14E:
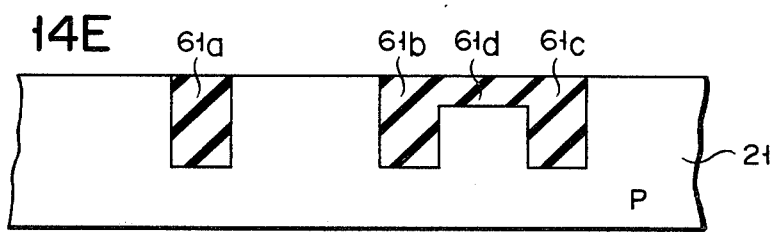

(III) As shown in FIG. 14D, the recessed CVD-SiO$_2$ film portion 59 was coated by photolithography with a resist film 60 and etching was then carried out using ammonium fluoride until the entire substrate 21, except that portion under resist film 60 and grooves 55a-55c, was exposed. As a result, field regions 61a, 61b and 61c were formed leaving CVD-SiO$_2$ in grooves 55a, 55b and 55c, and a field region 61d was formed integral by CVD-SiO$_2$ left in grooves 55b and 55c with its upper surface kept in the same level as that of substrate 21 (FIG. 14E). When a plurality of MOS transistors were arranged according to the usual manner on the substrate thus formed, the wide field region 61d formed by CVD-SiO$_2$ on the substrate 21 could be used to form wiring. In addition, discontinuity of the wiring is prevented because the field region 61d was made at the same level as the substrate 21.

EXAMPLE 7

Figure 15A:
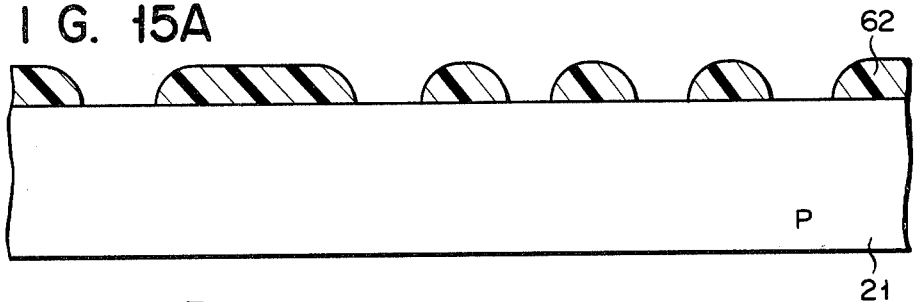
FIGS. 15A-15J are sectional views showing a process of manufacturing an n-channel MOS LSI in Example 7 of the present invention.
Figure 15B:
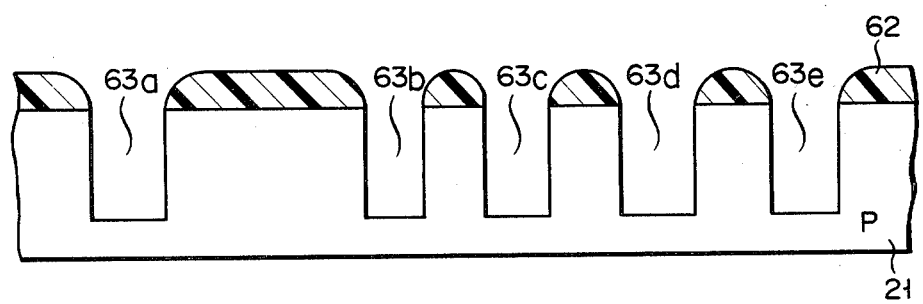
Figure 15C:
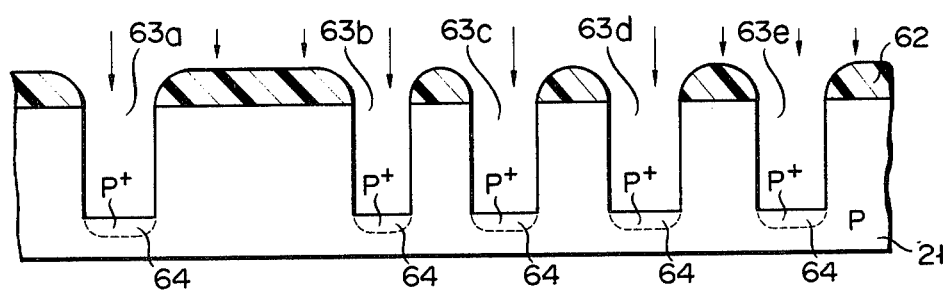

(I) A resist film was selectively removed, thus providing a resist pattern 62 which would be used as a mask for cutting grooves in a p-type silicon substrate 21 having crystal face (100) (FIG. 15A). The silicon substrate 21 was then etched by reactive ion-etching using the resist pattern 62 as a mask. As shown in FIG. 15B, a plurality of first grooves 63a –63e each having vertical side faces were formed. The groove 63a had a width of 1.5 μm and a depth of 2 μm and separated enough from other grooves. Grooves 63b–63e each having a width of 1 μm and a depth of 2 μm were formed adjacent to one another with a space of 1 μm interposed therebetween. After boron, which is an impurity of the same conductivity type as that of substrate 21, was ion-implanted under an accelerating voltage of 50 keV and dose of $5 \times 10^{12}/cm^2$ using the resist pattern as the mask, heat treatment was applied thereto to form p$^+$-regions 64 under the bottom of grooves 63a–63e, said p$^+$-regions 64 functioning as channel stopper regions (FIG. 15C).

Figure 15D:
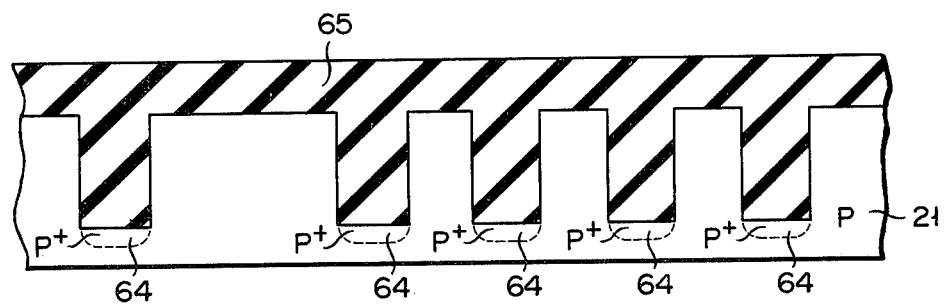
Figure 15E:
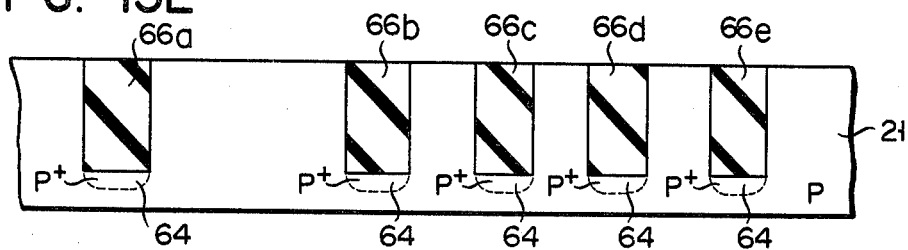

(II) After the resist pattern 62 was removed, SiO$_2$ was deposited by CVD to a depth (1.0 μm) larger than half (0.75 μm) the opening width of groove 63a. SiO$_2$ was gradually deposited on the substrate 21 and the inner surface of grooves 63a–63e and a CVD-SiO$_2$ film 65 was formed completely filling grooves 63a–63e, as shown in FIG. 15D. Because no heat treatment was carried out under high temperature and for a long time as is required in the selective oxidation method, no re-diffusion of the impurity of p$^+$-regions 64 occurred.

(III) The whole surface of CVD-SiO$_2$ film 65 was etched by ammonium fluoride until the main surface of silicon substrate 21 was exposed. The CVD-SiO$_2$ film 65 on the substrate 21 was removed at this time by the amount corresponding to the thickness or depth thereof to leave CVD-SiO$_2$ 66a–66e in first grooves 63a–63e.

Figure 15F:
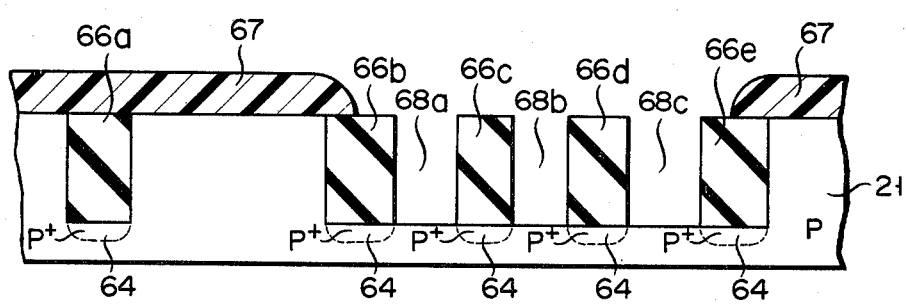
Figure 15G:
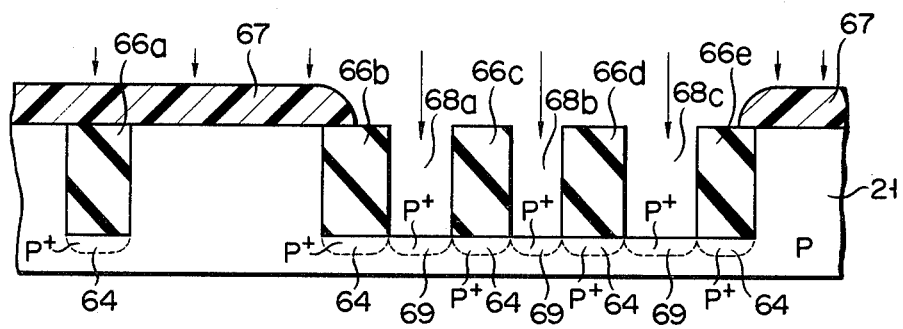

(IV) As shown in FIG. 15F, a resist film 67 is formed on the substrate 21 including a part of CVD-SiO$_2$ 66b and a part of CVD-SiO$_2$ 66e, leaving the other CVD-SiO$_2$ 66c and 66d and the remaining parts of CVD-SiO$_2$ 66b and 66e exposed. Using the resist film 67 as a mask, the substrate 21 is subjected to reactive ion-etching. As a result, the silicon substrate 21 left uncovered and exposed among CVD-SiO$_2$ 66b–66e was selectively removed at this time to form second three grooves 68a, 68b and 68c each having vertical side faces, a width of 1 μm and a depth of 2 μm. After boron, which is an impurity of the same conductivity type as that of substrate 21, was ion-implanted under an accelerating voltage of 50 keV and dose of $5 \times 10^{12}$/cm$^2$ using the resist film 67 as the mask, heat treatment was applied thereto to form p$^+$-regions 69, which function as channel stopper regions, under the bottom of second grooves 68a–68c (FIG. 15G).

Figure 15H:
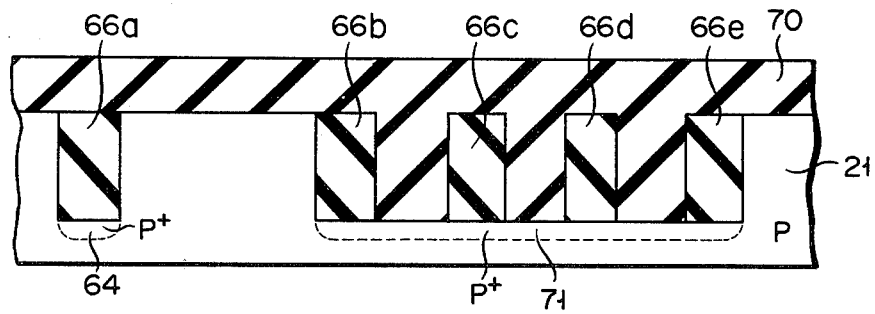

(V) After the resist film 67 was removed, SiO$_2$ was deposited by CVD to a thickness or depth (0.8 μm) larger than half (0.5 μm) the opening width of grooves 68a–68c. SiO$_2$ was gradually deposited on the substrate 21 and the inner surface of second grooves 68a–68c and a CVD-SiO$_2$ film 70 was formed completely filling second grooves 68a–68c, as shown in FIG. 15H. During the CVD process, p$^+$-regions 64 formed under the bottom of first grooves 63b–63e were made integral with p$^+$-regions 69 formed under the bottom of second grooves 68a–68c to form a wide p$^+$-region 71.

Figure 15I:
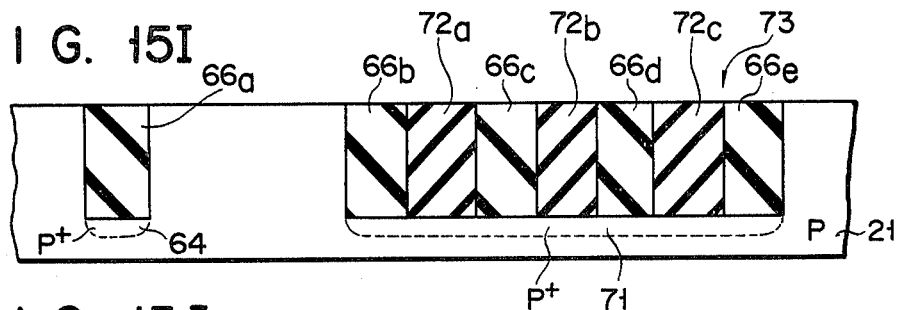
Figure 15J:
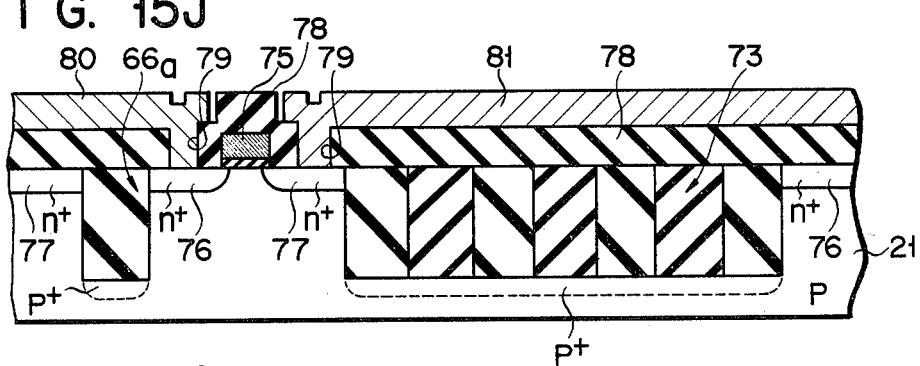

(VI) The whole surface of CVD-SiO$_2$ film 70 was etched by ammonium fluoride until the main surface of silicon substrate 21 was exposed. As shown in FIG. 15I, the CVD-SiO$_2$ film on the substrate 21 was removed by the amount corresponding to the thickness thereof, and CVD-SiO$_2$ 72a–72c left in second grooves 68a–68c were made integral with CVD-SiO$_2$ 66b–66e to form a field region 73 having a width of 7 μm. CVD-SiO$_2$ left in the first groove 63a could be used as a field region having a width of 1.5 μm. Thereafter, a gate electrode 75 consisting of polycrystalline silicon with a gate oxide film 74 interposed therebetween, was formed on an island region which is isolated by the narrow field region 66a and the wide field region 73. Arsenic diffusion was also applied to this island region to form n$^+$-regions 76 and 77 which function as source and drain. An interposing insulating film 78 consisting of CVD-SiO$_2$ was further deposited and after contact holes 79 (the contact hole for gate electrode is not shown) were formed at those portions of interposing insulating film 78 which corresponded to gate electrode 75 and n$^+$-regions 76, 77, an Al film was vacuum-vapored to the whole surface thereof and was patterned to form an Al electrode 80 for the source, an Al electrode 81 for the drain, and an Al electrode for the gate (not shown), thus finishing the manufacture of an n-channel MOS LSI (FIG. 15J).

The MOS LSI manufactured in this Example and narrow field region 66a and wide field region 73, and the silicon substrate 21 was made flat with no stepped portion formed between field regions and element forming regions after the formation of field regions 66a and 73, as shown in FIG. 15I. Therefore, when Al electrodes 80 and 81 were formed, a stepped portion as seen at the end of field region 54c in Example 5 was not caused and discontinuity of a metal electrode between the field regions and element forming region could be prevented. In addition, p$^+$-regions 64 and the 71, which function as channel stopper regions, were arranged under the bottom of grooves 63a, 63b–63e and 68a–68c and therefore not diffused into the element forming region, thus preventing the element property from being degraded due to the narrow channel effect, and preventing the floating capacity of n$^+$-regions 76 and 77 from being increased due to contact between p$^+$-regions 64, 71 and n$^+$-regions 76, 77, which function as source and drain. Further, the occurrence of leak current between elements could be prevented. Accordingly, a high quality and highly integrated MOS LSI could be obtained.

EXAMPLE 8

Figure 16A:
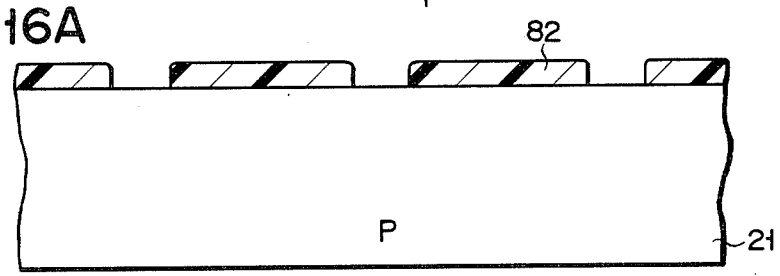
FIGS. 16A-16K are sectional views showing a process of manufacturing an n-channel MOS LSI in Example 8.

(I) A resist film 82 was patterned by photolithography on the p-type silicon substrate 21 having crystal orientation (100) (FIG. 16A).

Figure 16B:
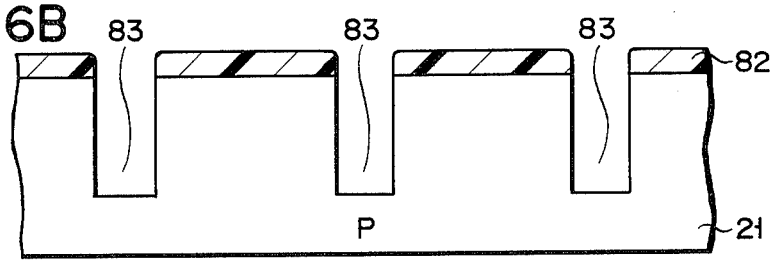

(II) Etching was applied thereto using the resist film 82 as a mask to form narrow grooves 83 each having vertical or substantially vertical side faces. Each of grooves 83 had a depth of 2 μm, for example. Ion etching or reactive ion-etching may be employed (FIG. 16B).

Figure 16C:
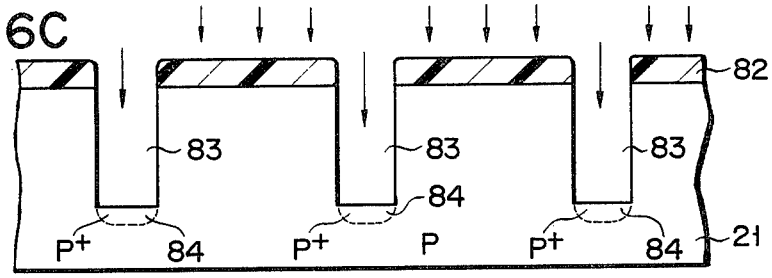

(III) Boron, for example, was ion-implanted under an accelerating voltage of 50 keV and dose of $5 \times 10^{12}$/cm$^2$ using the resist film 82 as the mask, to thereby form p$^+$-regions (or channel stopper regions) under the bottom of grooves 83 (FIG. 16C).

Figure 16D:
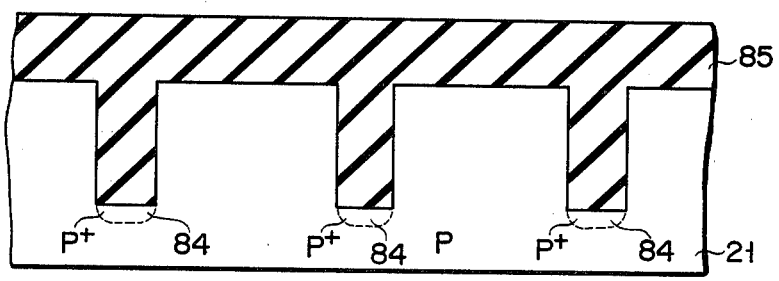

(IV) After the resist film 82 was removed, an insulating film 85 (CVD-SiO$_2$ film or Si$_3$N$_4$ film, for example) was deposited to a depth larger than half the width of the groove opening (when the width of groove is 0.1 μm, for example, the film thickness or depth becomes 0.6 μm, for example, larger than 0.5 μm) to fill the grooves (FIG. 16D).

Figure 16E:
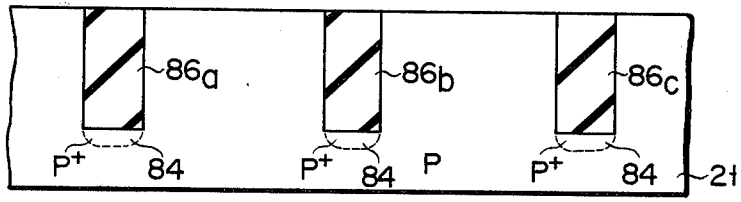

(V) The insulating film 85 was etched until the silicon substrate 21 was exposed to leave field insulating films 86a, 86b and 86c only in grooves 83 (FIG. 16E).

Figure 16F:
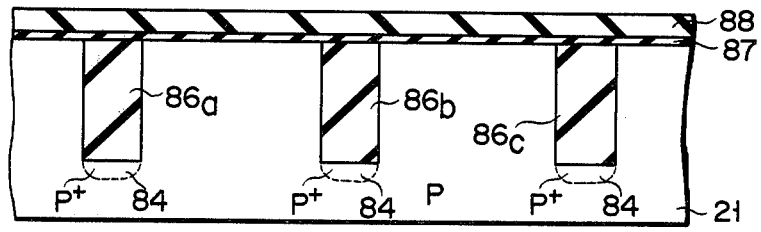

(VI) A thin insulating film 87 (thermal oxide film of 500 Å thickness, for example) was formed on the silicon substrate 21 and an oxidation-resistive film 88 (Si$_3$N$_4$ film of 3,000, for example) was deposited on the insulating film 87 (FIG. 16F).

Figure 16G:
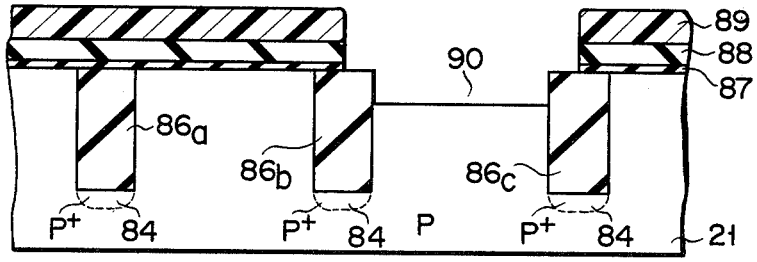

(VII) After the oxidation-resistive film 88 was coated by a resist film 89, the resist film 89 was patterned by photolithography removing a region between field insulating films 86b and 86c. The oxidation-resistive film 88 was etched using the resist film 89 as a mask, the thin insulating film 87 and then the silicon substrate 21 were further etched to form a groove 90. The silicon substrate 21 is etched in such way that the field insulating films 86b and 86c are not etched at all or are scarcely etched (FIG. 16G). Before the thin insulating film 87 or silicon substrate 21 is etched, the resist film may be removed and etching be then applied thereto using the oxidation-resistive film 88 as the mask. Although the depth by which the silicon substrate 21 is etched depends upon the condition of subsequent oxidation and the like, the etching depth of silicon substrate 21 was made 5,000 in this Example.

Figure 16H:
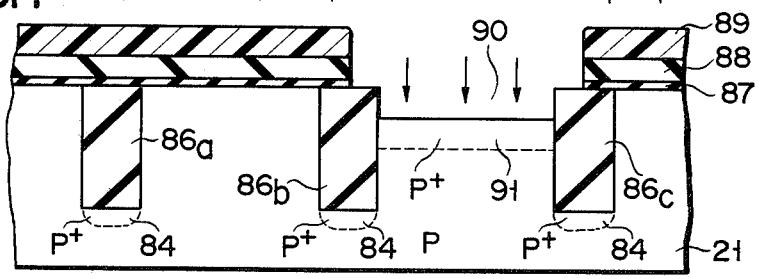

(VIII) Using the resist film 89 (or the oxidation-resistive film 88 when the resist film 89 was removed by the step (VII)) as the mask, boron, for example, was ion-implanted under an accelerating voltage of 50 keV and dose of $1 \times 10^{13}$/cm$^2$ to form a p$^+$-region 91 under the bottom of groove 90 (FIG. 16H).

Figure 16I:
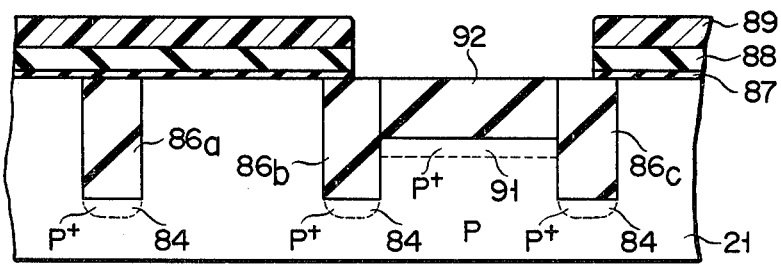

(IX) After the resist film 89 was removed, field oxidation was carried out using the oxidation resistive film 88 as the mask to form between embedded field insulating films 86b and 86c a field oxide film 92 having a film thickness of 1 μm, for example, with field oxide film 92 functioning as a wide field insulating film. If the field oxide film 92 is formed to have a thickness two times the etching depth of silicon substrate 21, it can be formed flat in the same level as the element forming region (FIG. 16I). When the Si$_3$N$_4$ film or the like is used as embedded field insulating films 86b and 86c, no bird's beaks are formed by the field oxide film 92 penetrating sideways at the time of field oxidation. When the SiO$_2$ film is used as embedded field insulating films 86b and 86c, birds' beak also provides almost no problem.

Figure 16J:
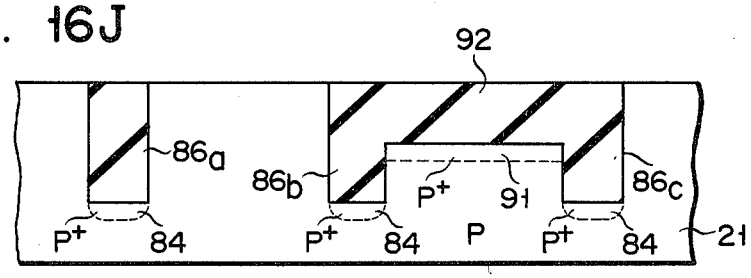

(X) The oxidation-resistive film 88 and the thin insulating film 87 under the oxidation-resistive film 88 were removed by etching (FIG. 16J).

Figure 16K:
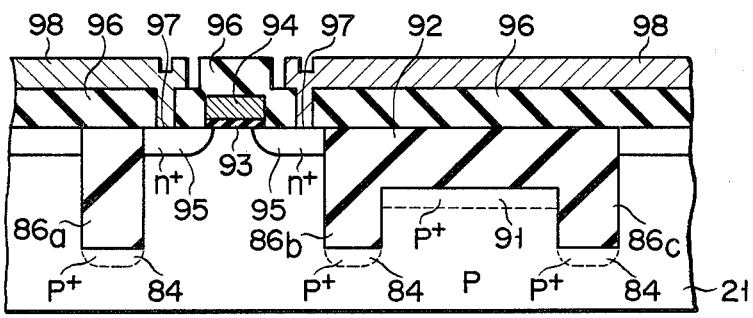

(XI) After gate oxide film 93 and gate electrode (polycrystalline silicon, for example) 94 were formed, arsenic, for example, was diffused to form n$^+$-regions 95, an interposing insulating film (CVD-SiO$_2$ film, for example) was deposited, contact holes 97 were formed, and Al interconnection electrode 98, for example, were arranged, thus finishing the main process of manufacturing an LSI (FIG. 16K).

According to Example 8 as described above, various disadvantages caused when the selective oxidation method was employed could be eliminated and a field insulating region having an optional width and no stepped portion could also be formed. Therefore, Example 8 could greatly facilitate the manufacture of highly integrated and high quality LSI.

Variations of Example 8 will be now described.

(1) Although ion implantation was carried out to form p$^+$-regions 84 (channel stopper regions) in Example 8 shown in FIGS. 16A–16K, ion implantation need not be carried out because p$^+$-regions 84 are not necessarily needed depending upon the condition of impurity concentration contained in the silicon substrate 21. The mask employed at the time of ion implantation is not limited to the resist film 82 but may be the insulating film.

Figure 17:
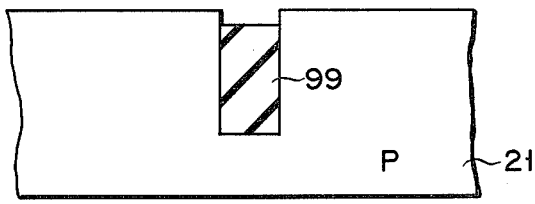
FIG. 17 is a sectional view showing a variation of those in Example 8.

(2) Before grooves 83 are filled with the insulating film 85, an insulating film 99 may be grown inside grooves 83 (FIG. 17). This insulating film 99 may be formed by oxidizing the silicon substrate 21, for example, or a CVD film or the like may be deposited. The opening width of grooves 83 is made narrower by two times the film thickness of insulating film 99.

(3) When the insulating film 85 is etched leaving field insulating films 86a, 86b and 86c embedded in grooves 83, the upper surface of field insulating films 86a, 86b and 86c may be made lower than that of silicon substrate 21 to form recesses.

(4) Field insulating films 86a, 86b and 86c may be different from one another in their depth.

(5) The insulating film 85 is deposited filling grooves 83 completely and a low-melting-point insulating film (such as boron phosphorus silicate glass (BPSG), phosphorus silicate glass (PSG) and arsenic silicate glass (AsSG), for example) is then deposited thereon. After the low-melting-point insulating film is then melted, the insulating film 85 may be etched leaving the insulating film 85 embedded in grooves 83.

(6) The above-mentioned low-melting-point insulating film may be used instead of insulating film 85. In the alternative, a two layer construction may also be employed using a melting film and a non-melting film.

(7) Although the Si$_3$N$_4$ film was used as the oxidation-resistive film 88 in Example 8 shown in FIGS. 16A–16K, whatever film such as an Al$_2$O$_3$ film and the thick SiO$_2$ film, for example, and capable of suppressing the oxidation of silicon substrate 21 may be employed.

(8) Although oxidation-resistive film 88 and silicon substrate 21 were etched by photolithography after the oxidation-resistive film 88 was deposited in Example 8 shown in FIGS. 16A–16K, the silicon substrate 21 may be etched first to form the groove 90, the oxidation-resistive film 88 is then deposited, with the oxidation-resistive film 88 left in the groove 90 to be etched by photolithography, and the field oxidation is then applied thereto.

Figure 18A:
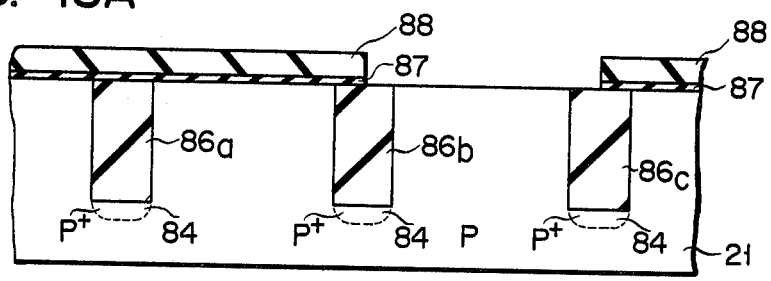
FIGS. 18A-18C are sectional views showing other variations of those in Example 8.
Figure 18B:
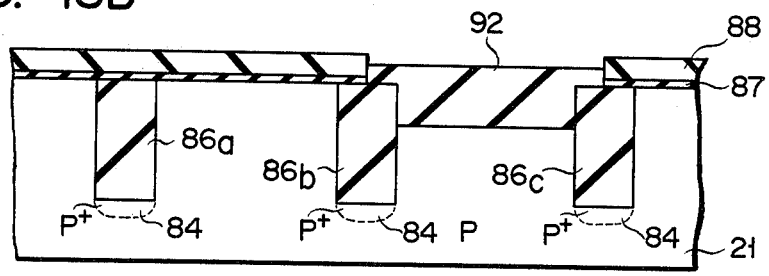

(9) Although the silicon substrate 21 was etched to form the groove 90 after the oxidation-resistive film 88 was etched, and field oxidation was then applied thereto, field oxidation may be carried out without etching the silicon substrate 21 after the oxidation-resistive film 88 is etched (FIGS. 18A and 18B). The flatness between the field region and the element forming region is lost more or less in this case, but the effect of suppressing the diffusion of channel stopper regions or p$^{30}$-regions into the element forming region is made great. It is not necessarily required that the insulating film 87 be deposited at this time. Even if the insulating film 87 is left like the SiO$_2$ film on the substrate, the substrate under the insulating film 87 may be oxidized at the time of field oxidation. Therefore, different from FIG. 18A, field oxidation may be carried out without etching the thin insulating film 87.

Figure 18C:
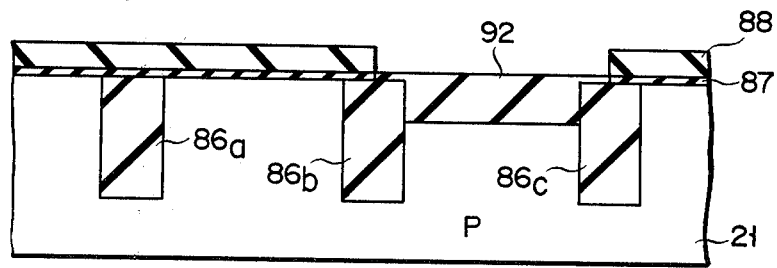

(10) As a further variation of (9), the field oxide film 92 may be etched using the oxidation-resistive film 88 to make the structure flat (FIG. 18C).

(11) The variation (10) can be applied to not only those formed by carrying out field oxidation without etching the silicon substrate 21 as in the variation (9), but also those formed by carrying out field oxidation with the silicon substrate 21. This is advantageous in the case where, in spite of silicon substrate 21 being etched, the field oxide film 92 is formed so thick as to project above the upper surface of silicon substrate 21 and to lose the flatness.

In Example 8 the field oxide film 92 is formed integral with both field insulating films 86b and 86c. Instead, it may be separated from one or both of the films 86b and 86c.

Although various Examples in which the present invention is applied to the manufacture of n-channel MOS LSI have been described above, it should be understood that the present invention can be applied to the manufacture of a p-channel MOS LSI.

What is claimed is:

1. A method for manufacturing a semiconductor device comprising:
    (a) forming at least one groove at a predetermined portion of a semiconductor substrate;
    (b) depositing insulating material on the surface of the semiconductor substrate including the groove, said insulating material being deposited until on the non-grooved surface of the substrate a depth greater than one half the opening width of the groove is achieved, thereby filling the groove with insulating material;
    (c) doping at least a part of the surface of the insulating material with low melting point material and melting this doping material by heat treatment;
    (d) etching the insulating material by the depth thereof on the non-grooved surface of the semiconductor substrate to form a field region consisting of insulating material left in the groove; and
    (e) forming an active element in that region of the semiconductor substrate which is isolated, at least in part, by said field region.

2. A method for manufacturing a semiconductor device comprising:
   (a) forming at least one groove at a predetermined portion of a semiconductor substrate;
   (b) depositing insulating material on the surface of the semiconductor substrate including the groove, said insulating material being deposited until on the non-grooved surface of the substrate a depth greater than one half the opening width of the groove is achieved, thereby filling the groove with insulating material;
   (c) depositing a low melting point insulating film on at least a part of the insulating material and melting the low melting point insulating film;
   (d) etching the insulating material by the depth thereof on the non-grooved surface of the semiconductor substrate to form a field region consisting of insulating material left in the groove; and
   (e) forming an active element in that region of the semiconductor substrate which is isolated, at least in part, by said field region.

3. A method for manufacturing a semiconductor device comprising:
   (a) forming at least one groove at a predetermined portion of a semiconductor substrate;
   (b) depositing two layers of insulating material on the surface of the semiconductor substrate including the groove, one of said layers having a low melting point, said insulating material layers being deposited until on the non-grooved surface of the substrate a total depth greater than one half the opening width of the groove is achieved, thereby filling the groove with insulating material; and melting the low melting point insulating layer;
   (c) etching the two layers of insulating material by the total depth thereof on the non-grooved surface of the semiconductor substrate to form a field region consisting of insulating material and low melting point insulating material left in the groove; and
   (d) forming an active element in that region of the semiconductor substrate which is isolated, at least in part, by said field region.

4. A method for manufacturing a semiconductor device comprising:
   (a) forming at least one groove at a predetermined portion of a semiconductor substrate;
   (b) depositing insulating material on the surface of the semiconductor substrate including the groove, said insulating material being deposited until on the non-grooved surface of the substrate a depth greater than one half the opening width of the groove is achieved, thereby filling the groove with insulating material;
   (c) forming a mask layer at that portion of the insulating material covering a part of the groove where a field region is to be formed;
   (d) etching the insulating material by the depth thereof on the non-grooved, non-masked surface of the semiconductor substrate to form a field region consisting of insulating material left in the groove and insulation material left under the mask layer; and
   (e) forming an active element in that region of the semiconductor substrate which is isolated, at least in part, by said field region.

5. A semiconductor device manufacturing method according to any one of claims 1 to 4 inclusive, wherein the side faces of said groove are made substantially vertical.

6. A semiconductor device manufacturing method according to any one of claims 1 to 4 inclusive, wherein the side faces of said groove are sloped and said groove has a V-shaped cross section.

7. A semiconductor device manufacturing method according to claim 6 wherein insulating material deposited on said semiconductor substrate has a thickness larger than $(a \cdot \cot \theta/2)/2$ in which "a" represents the opening width of the groove and $\theta$ the angle formed by the side face of the groove and a horizontal plane.

8. A semiconductor device manufacturing method according to any one of claims 1 to 4 inclusive, further including a step of oxidizing or nitriding at least a part of the groove, after the step (a) and before the step (b), to grow an oxide film or nitride film in such a way that the groove is not filled completely.

9. A semiconductor device manufacturing method according to any one of claims 1 to 4 inclusive, further including a step of doping the groove with impurities of the same conductivity type as that of the substrate after the step (a) and before the step (b).

10. A semiconductor device manufacturing method comprising the steps of:
    (a) forming a plurality of first grooves at predetermined portions of a semiconductor substrate in such a way that at least two grooves are arranged adjacent to one another;
    (b) depositing insulating material on the surface of the semiconductor substrate including the first grooves, said insulating material being deposited until on the non-grooved surface of the substrate to a depth greater than one half the opening width of each of the first grooves is achieved, thereby filling the first grooves with insulating material;
    (c) etching the insulating material by the depth thereof on the non-grooved surface of the semiconductor substrate to leave the insulating material layer in the first grooves;
    (d) selectively etching those portions of the semiconductor substrate which are between any two adjacent areas of insulating material left in the first grooves to form second groove(s);
    (e) depositing insulating material on the surface of the semiconductor substrate including the second groove(s), said insulating material being deposited until on the non-grooved surface of the semiconductor substrate a depth greater than one half the opening width of each of the second grooves(s) is achieved, thereby filling the second groove(s) with insulating material;
    (f) etching the insulating material by the depth thereof on the non-grooved surface of the semiconductor substrate to form a wide field region consisting of the insulating material layer left in the second groove(s) and the insulating material left in the first grooves on both sides of the second grooves; and
    (g) forming an active element in that region of the semiconductor substrate which is isolated, at least in part, by the wide field region.

11. A semiconductor device manufacturing method according to claim 10 further including a step of oxidizing or nitriding at least a part of the first and second grooves to grow an oxide film or nitride film in such a way that the first and second grooves are not filled completely after the step (d) and before the step (e), or after the step (a) and before the step (b).

12. A semiconductor device manufacturing method according to claim 10 further including a step of doping the inside of the first and second grooves with an impurity of the same conductivity type as that of the substrate after the step (d) and before the step (e), or after the step (a) and before the step (b).

13. A semiconductor device manufacturing method according to claim 10 further including a step of doping at least a part of the surface portion of the insulating material with a low melting-point-material and a step of melting the doping material by heat treatment after the step (e) and before the step (f) as well as after the step (b) and before the step (c).

14. A semiconductor device manufacturing method according to claim 10 further including a step of depositing a low-melting-point insulating film on at least a part of the insulting material and a step of melting the low-melting-point insulating film after the step (e) and before the step (f) as well as after the step (b) and before the step (a).

15. A semiconductor device manufacturing method comprising the steps of:
  (a) forming a plurality of first grooves at predetermined portions of a semiconductor substrate in such a way that at least two grooves are arranged adjacent to one another;
  (b) depositing insulating material on the surface of the semiconductor substrate including the first grooves, said insulating material being deposited until on the non-grooved surface of the semiconductor substrate a depth greater than one half the opening width of each of the first grooves is achieved, thereby filling the first grooves with insulating material;
  (c) etching the insulating material by the depth thereof on the non-grooved surface of the semiconductor substrate to leave the insulating material in the first grooves;
  (d) selectively etching at least part of the semiconductor substrate which is between any two adjacent areas of insulating material left in the first grooves to form second groove(s);
  (e) applying field oxidation to the second groove(s) using an oxidation-resistive film as a mask to fill the second groove(s) with an oxide film to form a wide field region comprising this oxide film and the insulating material left in the first grooves on both sides of the oxide film; and
  (f) forming an active element in that region of the semiconductor substrate which is isolated, at least in part, by the wide field region.

16. A semiconductor device manufacturing method according to claim 15 wherein after the etching according to the step (c), an oxidation-resistive film is deposited on the whole surface of the substrate thus formed, and the oxidation-resistive film and those portions of the semiconductor substrate which are between any two of the adjacent areas of insulating material left in the first grooves are selectively etched according to the step (d).

17. A semiconductor device manufacturing method according to claim 15 further including a step of oxidizing or nitriding at least a part of the first grooves to grow an oxide film or nitride film in such a way that the first grooves are not filled completely after the step (a) and before the step (b).

18. A semiconductor device manufacturing method according to claim 15 further including a step of doping the inside of the first and second grooves with impurity of the same conductivity type as that of the substrate after the step (d) and before the step (e) as well as after the step (a) and before the step (b).

19. A semiconductor device manufacturing method according to claim 15 further including a step of depositing a low-melting-point insulating film on at least a part of the insulating material and a step of melting the low-melting-point insulating film after the step (b) and before the step (c).

20. A semiconductor device manufacturing method according to claim 15 wherein an oxidation-resistive film is deposited on the whole surface of the substrate thus formed and the oxidation-resistive film in the second groove(s) is selectively etched after the step (d).

21. A semiconductor device manufacturing method according to claim 15 further including a step of etching a part of the field oxide film using the oxidation-resistive film as the mask to make flt the structure of the substrate thus formed after the step (e).

22. A semiconductor device manufacturing method according to any one of claims 10, 15, and 1 to 4 inclusive, wherein the groove is formed using a mask layer, insulating material is deposited on the surface of the mask layer and in the groove, and after etching the insulating material, the mask layer is removed to form a field region which projects from the substrate.

* * * * *